(12) United States Patent
Hagiwara et al.

(10) Patent No.: US 10,958,223 B2
(45) Date of Patent: Mar. 23, 2021

(54) AMPLIFIER

(71) Applicant: Mitsubishi Electric Corporation, Tokyo (JP)

(72) Inventors: Tatsuya Hagiwara, Tokyo (JP); Akihito Hirai, Tokyo (JP); Eiji Taniguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 354 days.

(21) Appl. No.: 16/076,251

(22) PCT Filed: Apr. 5, 2016

(86) PCT No.: PCT/JP2016/061084
§ 371 (c)(1),
(2) Date: Aug. 7, 2018

(87) PCT Pub. No.: WO2017/175295
PCT Pub. Date: Oct. 12, 2017

(65) Prior Publication Data
US 2020/0235706 A1    Jul. 23, 2020

(51) Int. Cl.
*H03F 3/04*    (2006.01)
*H03F 1/32*    (2006.01)
*H03F 3/19*    (2006.01)

(52) U.S. Cl.
CPC .............. *H03F 1/32* (2013.01); *H03F 3/19* (2013.01); *H03F 2200/451* (2013.01); *H03F 2201/3215* (2013.01)

(58) Field of Classification Search
CPC ...................................................... H03F 3/04
USPC .................................. 330/288; 323/315, 316
See application file for complete search history.

(56) References Cited

U.S. PATENT DOCUMENTS 6,756,850 B2 *    6/2004    Matsushita ............. H03F 1/301
330/285

FOREIGN PATENT DOCUMENTS

JP          2010-273284 A    12/2010
WO    WO 2015/010328 A1    1/2015

OTHER PUBLICATIONS

Office Communication pursuant to Article 94(3) EPC issued in corresponding European Application No. 16 897 854.2 dated Nov. 21, 2019.
Extended European Search Report issued in corresponding European Application No. 16897854.2 dated Mar. 6, 2019.
(Continued)

*Primary Examiner* — Henry Choe
(74) *Attorney, Agent, or Firm* — Birch, Stewart, Kolasch & Birch, LLP

(57) ABSTRACT

There has been a problem that linearity is degraded in the conventional amplifier when the idle current is reduced in order to lower the power consumption.
An amplifier of the present invention includes: a bias circuit to cause a bias current to flow; an amplifying element to amplify a signal by causing an output current corresponding to the bias current to flow; a bias current subtracting circuit to detect the signal and subtract, from the bias current, a current based on an amplitude of the signal detected; and a bias current adding circuit having an operation starting point higher than an operation starting point of the bias current subtracting circuit, and to detect the signal and add, to the bias current, a current based on an amplitude of the signal detected.

5 Claims, 3 Drawing Sheets

(56) References Cited

OTHER PUBLICATIONS

Shinjo et al., "High $P_{1dB}$; and Low Quiescent Current SiGe HBT Power Amplifier MMIC Using Self Base Bias Control Circuit for 5.8GHz ETC Terminals", IEEE Radio Frequency Integrated Circuits (RFIC) Symposium, 2003, pp. 195-198.

* cited by examiner

AMPLIFIER

TECHNICAL FIELD

The present invention relates to an amplifier used for satellite communication, terrestrial microwave communication, and mobile communication.

BACKGROUND ART

Patent Literature 1 discloses a conventional radio frequency amplifier. The conventional radio frequency amplifier includes a radio frequency differential signal input terminal, a radio frequency differential signal output terminal, a radio frequency amplifying element, a bias FET, a load resistor, a bias resistor, a constant current source, a power supply, an input power detecting FET, and a current mirror FET.

Next, the operation will be described. First, a radio frequency differential signal is input from the radio frequency differential signal input terminal. The radio frequency differential signal is amplified by the radio frequency amplifying element and output from the radio frequency differential signal output terminal. Because the radio frequency amplifying element and the bias FET constitute a current mirror circuit, a current of the bias FET is copied to the radio frequency amplifying element at a predetermined current mirror ratio. Because the current of the bias FET is determined by an output current of the constant current source, the output current of the constant current source is applied, as a bias current, to the radio frequency amplifying element depending on the predetermined current mirror ratio.

Here, when power of a radio frequency input signal increases, a drain current of the input power detecting FET increases as a result of rectifying the radio frequency signal. The increased drain current is added to the output current of the constant current source and supplied to the bias FET via the current mirror FET. Therefore, the current of the bias FET increases. Since the current of the bias FET increases, a current of the radio frequency amplifying element constituting the current mirror circuit together with the bias FET also increases. In this way, the conventional radio frequency amplifier can change a bias condition of the radio frequency amplifying element depending on the power of the radio frequency input signal.

Thus, in a region where the linear characteristic of the gain of the radio frequency amplifier has a downward swing at high input power, by performing operation of increasing the bias current of the radio frequency amplifier depending on input power, there is an effect that high saturation power can be achieved. Here, the downward swing means that gain compression occurs (the gain decreases) with respect to the input power. Note that, an upward swing means that gain expansion occurs (the gain increases) with respect to input power.

CITATION LIST

Patent Literature

Patent Literature 1: JP 2010-273284 A

SUMMARY OF INVENTION

Technical Problem

Since the conventional radio frequency amplifier is configured as described above, a high saturation characteristic can be obtained, but when operating conditions (bias conditions) of the radio frequency amplifying elements 1 and 2 are brought closer to those of class B operation from class A operation and the idle currents are reduced in order to reduce power consumption, there is only a function to increase the currents of the radio frequency amplifying elements 1 and 2, and thus there is a problem that the upward swing of the gain occurs at high input power and linearity degrades.

The present invention has been made in order to solve the above problem and aims to provide an amplifier capable of suppressing degradation of the linearity even when the idle current of the amplifier is reduced.

Solution to Problem

An amplifier of the present invention includes: a bias circuit to cause a bias current to flow; an amplifying element to amplify a signal by causing an output current corresponding to the bias current to flow; a bias current subtracting circuit to detect the signal and subtract, from the bias current, a current based on an amplitude of the signal detected; and a bias current adding circuit having an operation starting point higher than an operation starting point of the bias current subtracting circuit, and to detect the signal and add, to the bias current, a current based on an amplitude of the signal detected.

Advantageous Effects of Invention

According to the invention, degradation of the linearity can be suppressed even when the idle current of the amplifier is reduced.

DESCRIPTION OF EMBODIMENTS

Embodiment 1

Figure 1:
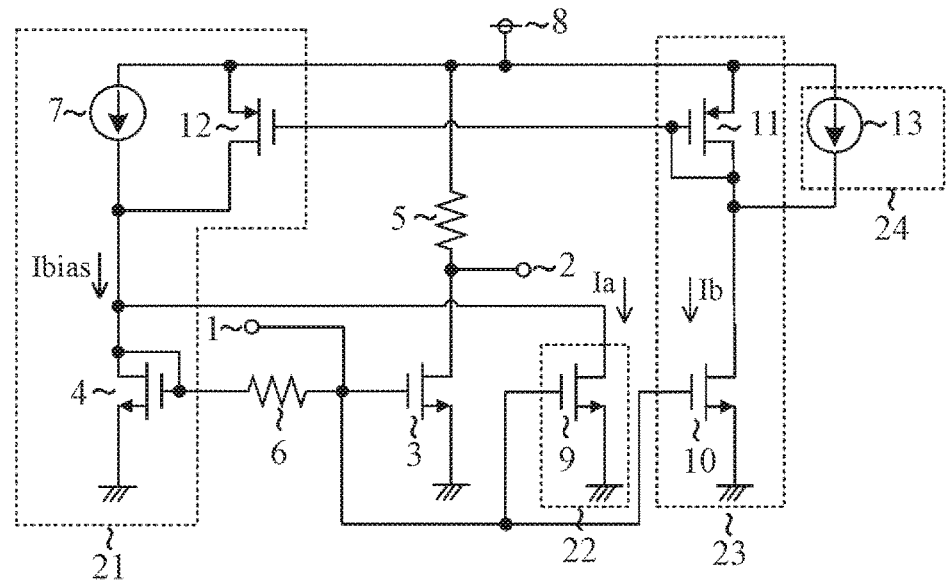
FIG. 1 is a circuit diagram illustrating a configuration example of a radio frequency amplifier according to Embodiment 1 of the invention.

FIG. 1 is a circuit diagram illustrating a configuration example of a radio frequency amplifier according to Embodiment 1 of the invention.

The radio frequency amplifier includes an input terminal 1, an output terminal 2, a radio frequency amplifying transistor 3 (an example of an amplifying element), a load resistor 5, a bias resistor 6, a power supply terminal 8, a bias circuit 21, a bias current subtracting circuit 22, a bias current adding circuit 23, and an offset circuit 24.

The input terminal 1 is a terminal to which a radio frequency signal is input.

The output terminal 2 is a terminal from which the radio frequency signal amplified is output.

The radio frequency amplifying transistor 3 is a transistor for amplifying the radio frequency signal input. The gate terminal (control terminal) of the radio frequency amplifying transistor 3 is connected to the gate terminal of a bias transistor 4 via the bias resistor 6. The drain terminal (current supply terminal) of the radio frequency amplifying transistor 3 is connected to the load resistor 5 and the output terminal 2. The source terminal (current supplied terminal) of the radio frequency amplifying transistor 3 is connected to GND. The radio frequency amplifying transistor 3 is an n-type transistor, and, for example, a Metal-Oxide-Semiconductor (MOS) transistor, a bipolar transistor, a Field Effect Transistor (FET), or the like is used.

The bias circuit 21 is a circuit through which a bias current corresponding to a drain current of the radio frequency amplifying transistor 3 flows. The bias circuit 21 includes the bias transistor 4 (an example of a first transistor), a current mirror transistor 12 (an example of a second transistor), and a current source 7. The bias transistor 4 is in a current mirror relationship with the radio frequency amplifying transistor 3, and the bias current flowing through the bias transistor 4 is copied to the radio frequency amplifying transistor 3 at a predetermined current mirror ratio. The current mirror ratio is determined by a ratio between the size of the bias transistor 4 and the size of the radio frequency amplifying transistor 3. The gate terminal of the bias transistor 4 is connected to the drain terminal of the bias transistor 4, and is connected to the gate terminal of the radio frequency amplifying transistor 3 via the resistor 6. The drain terminal of the bias transistor 4 is connected to the current source 7 and the drain terminal of the current mirror transistor 12. The source terminal of the bias transistor 4 is connected to GND. The source terminal of the current mirror transistor 12 is connected to the power supply terminal 8, and the bias current is supplied to the bias transistor 4. The current source 7 is connected in parallel to the current mirror transistor 12 and supplies an offset current to the bias transistor 4. The bias transistor 4 is an n-type transistor, and the current mirror transistor 12 is a p-type transistor. For example, a MOS transistor, a bipolar transistor, an FET, or the like is used for the bias transistor 4 and the current mirror transistor 12.

The bias current subtracting circuit 22 is connected in parallel to an input terminal of the radio frequency amplifying transistor 3, detects power of a radio frequency input signal, and subtracts a current Ia from the bias current of the bias transistor 4 depending on the power detected. The bias current subtracting circuit 22 includes an input power detecting transistor 9 (an example of a third transistor). The gate terminal of the input power detecting transistor 9 is connected to the input terminal 1, the resistor 6, and the gate terminal of the radio frequency amplifying transistor 3, and the drain terminal of the input power detecting transistor 9 is connected to the current source 7, the drain terminal of the current mirror transistor 12, and the drain terminal of the bias transistor 4. The bias transistor 4 and the input power detecting transistor 9 are in a current mirror relationship with each other. Bias of the input power detecting transistor 9 is the same as bias of the radio frequency amplifying transistor 3. For example, if the bias of the radio frequency amplifying transistor 3 is bias of the class B, the bias of the input power detecting transistor 9 is also bias of the class B. In addition, the size of the input power detecting transistor 9 is desirably made sufficiently small as compared with that of the radio frequency amplifying transistor 3 in order not to degrade efficiency of the radio frequency amplifier. The input power detecting transistor 9 is a transistor of the same type as that of the radio frequency amplifying transistor 3, and, for example, a MOS transistor, a bipolar transistor, an FET or the like is used. Note that, the bias current subtracting circuit 22 may be any circuit as long as it is a circuit for detecting input power and controls the current of the circuit depending on the power detected.

The bias current adding circuit 23 is a circuit for detecting the power of the radio frequency input signal and adds a bias current to the bias transistor 4 depending on the power detected. The bias current adding circuit 23 includes an input power detecting transistor 10 (an example of a fourth transistor) and a current mirror transistor 11 (an example of a fifth transistor). The gate terminal of the input power detecting transistor 10 is connected to the input terminal 1, the resistor 6, and the gate terminal of the radio frequency amplifying transistor 3, the drain terminal of the input power detecting transistor 10 is connected to a current source 13 and the drain terminal of the current mirror transistor 11, and the source terminal of the input power detecting transistor 10 is connected to GND. The gate terminal of the current mirror transistor 11 is connected to the drain terminal of the current mirror transistor 11 and the gate terminal of the current mirror transistor 12, the drain terminal of the current mirror transistor 11 is connected to the drain terminal of the input detecting transistor 10 and the offset circuit 24, and the source terminal of the current mirror transistor 11 is connected to the power supply terminal 8 and the offset circuit 24. The current mirror transistor 11 supplies a current supplied from the power supply terminal 8 to the input power detecting transistor 10. The current mirror transistor 11 and the current mirror transistor 12 are in a current mirror relationship with each other, and the current flowing through the current mirror transistor 11 is copied to the current mirror transistor 12. The current mirror transistor 11 is a p-type transistor, and for example, a MOS transistor, a bipolar transistor, an FET, or the like is used.

In addition, the bias transistor 4 and the input power detecting transistor 10 are in a current mirror relationship with each other. Bias of the input power detecting transistor 10 is the same as the bias of the radio frequency amplifying transistor 3. For example, if the bias of the radio frequency amplifying transistor 3 is bias of the class B, the bias of the input power detecting transistor 10 is also bias of the class B. In addition, the size of the input power detecting transistor 10 is desirably made sufficiently small as compared with that of the radio frequency amplifying transistor 3 in order not to degrade the efficiency of the radio frequency amplifier. The input power detecting transistor 9 is a transistor of the same type as that of the radio frequency amplifying transistor 3, and, for example, a MOS transistor, a bipolar transistor, an FET or the like is used. Note that, the bias current adding circuit 23 may be any circuit as long as it is a circuit for detecting input power and controls the current of the circuit depending on the power detected. In addition, the bias current adding circuit 23 may include the offset circuit 24.

The offset circuit 24 is a circuit for supplying a current of the current source 13 to the bias current adding circuit 23 so as to offset an operation starting point of the bias current adding circuit 23. As the current of the current source 13 increases, an offset amount increases, and the operation starting point of the bias current adding circuit 23 shifts to the high input power side. Here, a ratio between the current of the current source 13 and the current of the current source 7 corresponds to a current mirror ratio of a current mirror circuit including the current mirror transistor 11 and the current mirror transistor 12. The current source 13 is connected in parallel to the current mirror transistor 11. For example, for the current source 13, a circuit in which a resistor is loaded to a constant voltage source, or a band gap current source circuit is used.

Next, the operation of the radio frequency amplifier according to Embodiment 1 of the invention will be described.

The radio frequency signal is input from the input terminal 1 and input to the radio frequency amplifying transistor 3. At this time, because the input impedance is increased by the load resistor 4, the radio frequency signal is not substantially input to the bias transistor 4. The radio frequency amplifying transistor 3 amplifies the radio frequency signal and outputs the amplified radio frequency signal from the output terminal 2. When the power of the radio frequency signal is low, since the radio frequency amplifying transistor 3 and the bias transistor 4 constitute a current mirror circuit, the current of the current source 7 is applied from the power supply terminal 8 to the radio frequency amplifying transistor 3 depending on the current mirror ratio.

When the power of the input radio frequency signal increases, the input power detecting transistor 9 increases the drain current Ia by a rectification function, and therefore, performs operation of subtracting Ia from a bias current Ibias output from the current source 7 depending on an increase amount of the radio frequency input power.

On the other hand, the input power detecting transistor 10 also increases the drain current Ib when the power of the radio frequency signal increases, but since the input power detecting transistor 10 is connected to the current mirror transistor 11, the increased drain current is multiplied by the current mirror ratio via the current mirror transistors 11 and 12, and added to the bias current Ibias.

Here, since the current source 13 applies a constant offset current to the input power detecting transistor 10, until the drain current of the input power detecting transistor 10 increases and exceeds the offset current, the drain current does not flow through the current mirror transistors 11 and 12. That is, when the input power is small, the drain current of the input power detecting transistor 10 does not increase and no drain current flows through the current mirror transistors 11 and 12. When the input power exceeds a certain input power and the drain current of the input power detecting transistor 10 exceeds the offset current of the current source 13, the increased drain current of the input power detecting transistor 10 (ΔIb=the drain current of the input power detecting transistor 10−the offset current of the current source 13) is added to the bias current Ibias via the current mirror transistors 11 and 12.

Figure 2:
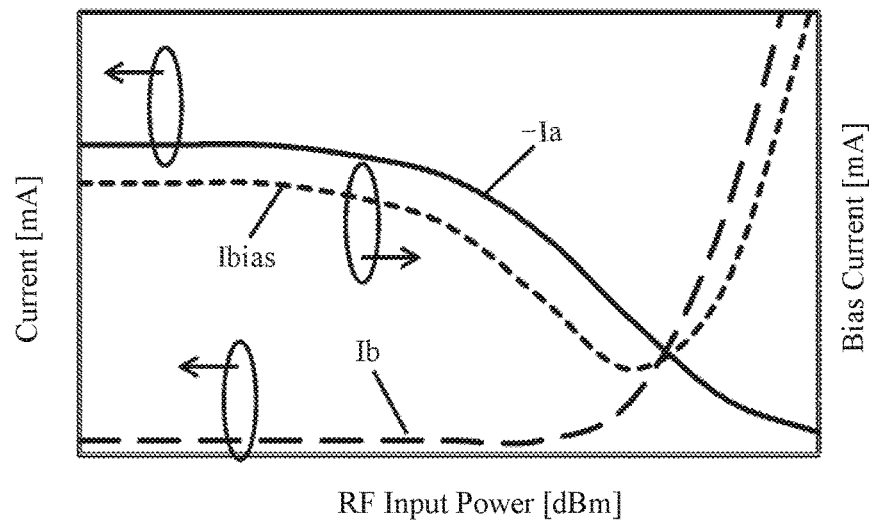
FIG. 2 is a characteristic diagram illustrating current characteristics with respect to input power of the radio frequency amplifier according to Embodiment 1 of the invention.

FIG. 2 is a characteristic diagram illustrating current characteristics with respect to the input power of the radio frequency amplifier according to Embodiment 1 of the invention.

Ia is the drain current of the input power detecting transistor 9, Ib is the drain current of the input power detecting transistor 10, and Ibias is the drain current of the bias transistor 4. Note that, since the bias transistor 4 and the radio frequency amplifying transistor 3 constitute the current mirror circuit, Ibias corresponds to the drain current of the radio frequency amplifying transistor 3.

Since the input power detecting transistor 9 of the bias current subtracting circuit 22 increases the drain current with an increase of the input power, Ia increases with respect to the input power. The input power detecting transistor 9 is connected in parallel to the bias transistor 4, and Ia is a current branched from the bias current Ibias, so that Ibias decreases as Ia increases. That is, the input power detecting transistor 9 performs operation of subtracting Ia from Ibias. For that reason, in FIG. 2, the change of −Ia and the change of Ibias correspond to each other.

When the input power increases and exceeds a predetermined power, the input power detecting transistor 10 of the bias current adding circuit 23 increases the drain current Ib, and increases the bias current Ibias via the current mirror transistors 11 and 12. As a result, the input power detecting transistor 10 performs operation of adding the increase amount ΔIb of the drain current of the input power detecting transistor 10 to the bias current Ibias of the bias transistor 4. For that reason, in FIG. 2, in a region where the input power is high, the change of Ibias and the change of Ib correspond to each other.

The operation starting point (the point at which the increase of Ib starts) of the input power detecting transistor 10 is different from the operation starting point (the point at which the increase of Ia starts) of the input power detecting transistor 9, and this is because the current source 13 of the offset circuit 24 supplies the offset current to the input power detecting transistor 10. Since the input power detecting transistor 10 does not operate until Ib exceeds the offset current of the current source 13, the current source 13 applies an offset to the operation starting point of the input power detecting transistor 9. Thus, as illustrated in FIG. 2, the currents have characteristics in which Ia increases first with the increase in the radio frequency input power, and when the input power further increases, the increase of Ib starts. Therefore, Ibias has a characteristic in which Ibias first decreases with the increase of the input power, and then increases when the input power further increases.

Figure 3:
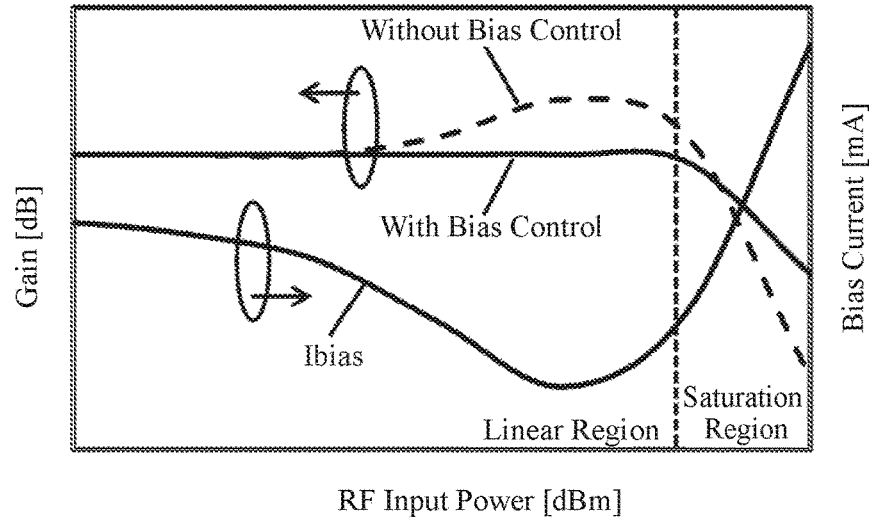
FIG. 3 is an explanatory diagram illustrating a relationship between a bias current and gain characteristics with respect to the input power of the radio frequency amplifier according to Embodiment 1 of the invention.

FIG. 3 is an explanatory diagram illustrating a relationship between a bias current and gain characteristics with respect to the input power of the radio frequency amplifier according to Embodiment 1 of the invention.

Ibias is the drain current of the bias transistor 4 and corresponds to the drain current of the radio frequency amplifying transistor 3. The solid line is a gain characteristic when the bias control described above is performed, and the broken line is a gain characteristic when the bias control is not performed. In the linear region illustrated in FIG. 3, the operation of the bias current subtracting circuit 22 becomes dominant and the bias current Ibias decreases. Since Ibias and the gain of the radio frequency amplifying transistor 3 correspond to each other, due to the decrease of Ibias, the gain also decreases. When the bias control is not performed, Ibias decreases in a region where the gain increases, whereby an upward swing of the gain caused when the idle current is reduced is suppressed.

Further, in the saturation region where the input power is increased, the operation of the bias current adding circuit 23 becomes dominant and the bias current Ibias increases. Thus, since the gain of the radio frequency amplifying transistor 3 increases, a downward swing of the gain is suppressed and saturation power increases. Therefore, the radio frequency amplifier according to the present embodiment can improve linearity (gain flatness) over a wide input power range.

As described above, according to the radio frequency amplifier of Embodiment 1, the bias current Ibias is decreased in the linear region where the upward swing of the gain occurs, and the bias current Ib is increased in the saturation region where the downward swing of the gain occurs, so that the linearity can be improved even if the idle current is reduced.

Note that, by adjusting the offset current output by the current source 13, an input power point for switching between decrease and increase of the bias current can be varied, and the bias current can be appropriately adjusted depending on the gain characteristic of the radio frequency amplifying transistor 3.

Embodiment 2

Figure 4:
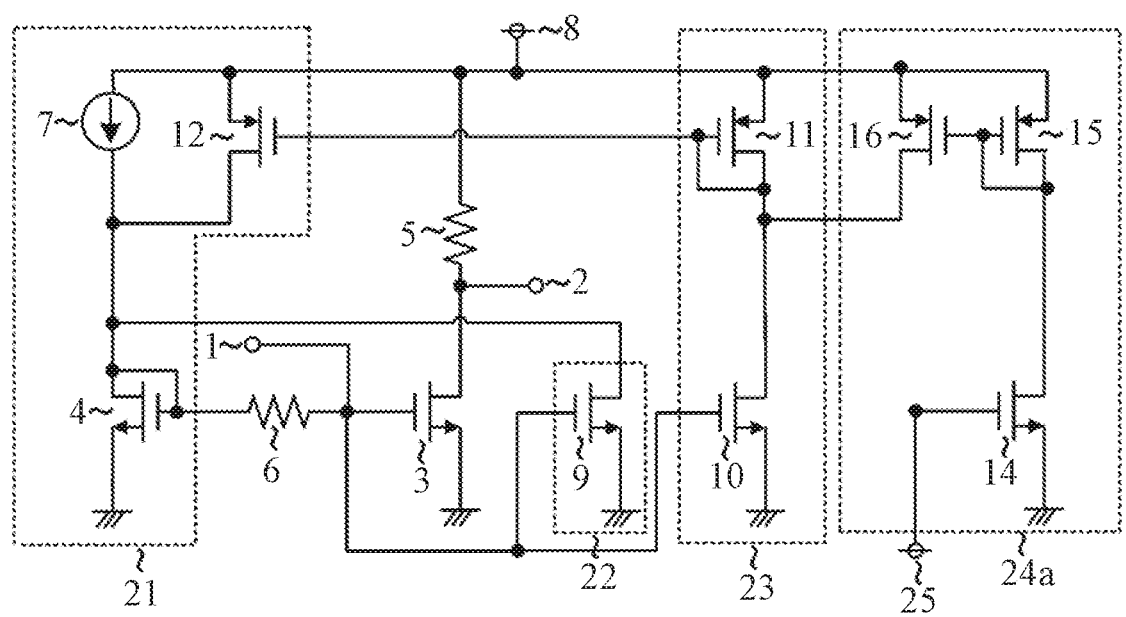
FIG. 4 is a configuration diagram illustrating a configuration example of a radio frequency amplifier according to Embodiment 2 of the invention.

FIG. 4 is a configuration diagram illustrating a configuration example of a radio frequency amplifier according to Embodiment 2 of the invention.

In FIG. 4, the same reference numerals as those in FIG. 1 denote the same or corresponding parts, so that descriptions thereof are omitted. In the radio frequency amplifier according to Embodiment 2, an offset circuit 24a is provided instead of the offset circuit 24 in Embodiment 1, and the offset circuit 24a includes a bias transistor 14 (an example of a sixth transistor), and current mirror transistors 15 (an example of a seventh transistor) and 16 (an example of an eighth transistor).

In the offset circuit 24a, the current mirror transistor 15 and the current mirror transistor 16 constitute a current mirror circuit, and the drain terminal of the current mirror transistor 16 is connected to the drain terminal of the bias transistor 14. The gate terminal of the bias transistor 14 is connected to a power supply terminal 25. The current mirror transistor 15 is connected in parallel to the current mirror transistor 11. The current mirror transistor 15 and the current mirror transistor 16 are p-type transistors.

Next, the operation will be described of the radio frequency amplifier according to Embodiment 2. Since operations other than the operation of the offset circuit 24a are the same as those in Embodiment 1, the operation of the offset circuit 24a will be described.

In the offset circuit 24a, the bias transistor 14 causes a drain current to flow depending on a gate voltage supplied by the power supply terminal 25. Because the drain current of the bias transistor 14 flows through the bias transistor 14 via the current mirror transistor 15, a drain current of the current mirror transistor 15 is equal to the drain current of the bias transistor 14. Since the current mirror transistor 15 and the current mirror transistor 16 constitute the current mirror circuit, the drain current of the current mirror transistor 15 is copied to the current mirror transistor 16 at a predetermined current mirror ratio. The current mirror transistor 16 supplies the copied drain current to the bias adding circuit 23. In this way, the offset circuit 24a copies the drain current of the bias transistor 14 by using the current mirror circuit and supplies the drain current to the bias adding circuit 23, so that the offset circuit 24a operates as a current source for supplying a constant current.

As is apparent from the above, according to Embodiment 2, since the offset current source is configured by using the current mirror circuit, in addition to the effect of Embodiment 1, there is an effect that the offset current source can be compactly configured on an integrated circuit.

Here, a radio frequency amplifier having a single-phase configuration has been shown, but the radio frequency amplifier of the present invention may have a differential configuration.

Figure 5:
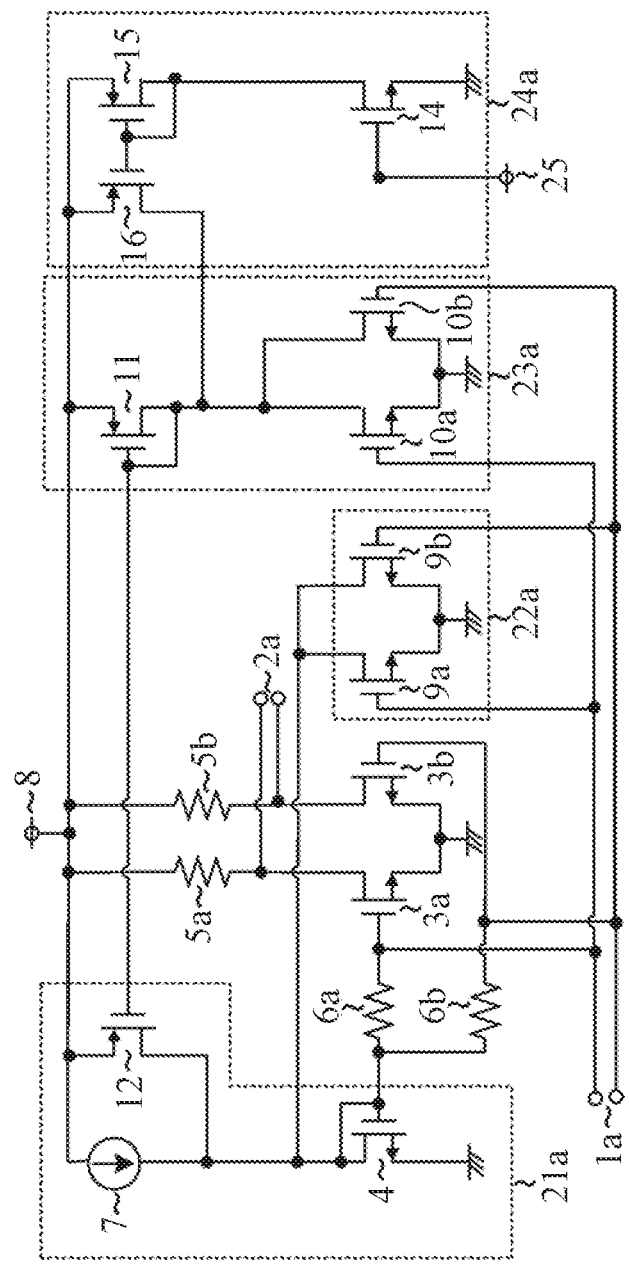
FIG. 5 is a configuration diagram illustrating another configuration example of the radio frequency amplifier according to Embodiment 2 of the invention.

FIG. 5 is a configuration diagram illustrating another configuration example of the radio frequency amplifier according to Embodiment 2 of the invention.

A radio frequency amplifier of FIG. 5 is obtained by making the radio frequency amplifier of FIG. 4 have a differential configuration, and in FIG. 5, the same reference numerals as those in FIG. 4 denote the same or corresponding parts, so that descriptions thereof are omitted. Radio frequency amplifying transistors 3a and 3b correspond to the radio frequency amplifying transistor 3 and constitute a current mirror circuit together with the bias transistor 4. Bias resistors 6a and 6b correspond to the resistor 6. Input detecting transistors 9a and 9b correspond to the input detecting transistor 9, and input detecting transistors 10a and 10b correspond to the input detecting transistor 10. Load resistors 5a and 5b correspond to the load resistor 5. A bias current subtracting circuit 23a corresponds to the bias current subtracting circuit 23, and the input detecting transistor has a differential circuit configuration. The input power detecting transistors 10a and 10b correspond to the input power detecting transistor 10.

Even if the radio frequency amplifying transistor and the input detecting transistor are made to have differential configurations, an effect similar to the effect of the radio frequency amplifier of FIG. 4 can be obtained. In addition, by adopting the differential configuration, a radio frequency differential signal can be amplified and satisfactory noise performance can be obtained.

In the invention of the present application, within the scope of the invention, free combination of each embodiment, a modification of any component of each embodiment, or omission of any component in each embodiment is possible.

REFERENCE SIGNS LIST 1, 1a: Input terminal, 2, 2a: Output terminal, 3, 3a, 3b: Radio frequency amplifying transistor, 4: Bias transistor, 5, 5a, 5b: Load resistor, 6, 6a, 6b: Bias resistor, 7: Current source, 8: Power supply terminal, 9, 9a, 9b: Input power detecting transistor, 10, 10a, 10b: Input power detecting transistor, 11: Current mirror transistor, 12: Current mirror transistor, 13: Current source, 14: Bias transistor, 15: Current mirror transistor, 16: Current mirror transistor, 21, 21a: Bias circuit, 22, 22a: Bias current subtracting circuit, 23, 23a: Bias current adding circuit, 24, 24a: Offset circuit, 25: Power supply terminal

The invention claimed is:
1. An amplifier comprising:
a bias circuit to cause a bias current to flow;
an amplifying element to amplify a signal by causing an output current corresponding to the bias current to flow;
a bias current subtracting circuit to detect the signal and subtract, from the bias current, a current based on an amplitude of the signal detected; and
a bias current adding circuit having an operation starting point higher than an operation starting point of the bias current subtracting circuit, and to detect the signal and add, to the bias current, a current based on an amplitude of the signal detected.
2. The amplifier according to claim 1, comprising
a current source connected to the bias current adding circuit, and to supply an offset current for offsetting the operation starting point, wherein
the bias circuit and the bias current adding circuit are in a current mirror relationship with each other.

3. The amplifier according to claim 2, wherein
the bias circuit includes a first transistor being in a current mirror relationship with the amplifying element, and a second transistor to supply the bias current to the first transistor,
the bias current subtracting circuit includes a third transistor connected to the second transistor, and to detect the signal and subtract, from the bias current, a current based on an amplitude of the signal detected, and
the bias current adding circuit includes a fourth transistor to detect the signal and cause a current based on an amplitude of the signal detected to flow, a fifth transistor to supply a current to the fourth transistor and being in a current mirror relationship with the second transistor, and the current source connected in parallel with the fifth transistor.

4. The amplifier according to claim 2, wherein
the current source includes
a sixth transistor whose current supplied terminal is grounded,
a seventh transistor connected to the sixth transistor, and to supply a current to the sixth transistor, and
an eighth transistor being in a current mirror relationship with the seventh transistor, and connected to the bias current adding circuit.

5. The amplifier according to claim 2, wherein the amplifying element, the bias current subtracting circuit, and the bias current adding circuit are differential circuits.

* * * * *